(12) United States Patent
Harrison et al.

(10) Patent No.: US 11,133,190 B2
(45) Date of Patent: Sep. 28, 2021

(54) METAL-BASED PASSIVATION-ASSISTED PLASMA ETCHING OF III-V SEMICONDUCTORS

(71) Applicant: Lawrence Livermore National Security, LLC, Livermore, CA (US)

(72) Inventors: Sara E. Harrison, Fremont, CA (US); Clint Frye, Livermore, CA (US); Rebecca J. Nikolic, Oakland, CA (US); Qinghui Shao, Fremont, CA (US); Lars F. Voss, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 15/971,999

(22) Filed: May 4, 2018

(65) Prior Publication Data

US 2018/0323074 A1 Nov. 8, 2018

Related U.S. Application Data

(60) Provisional application No. 62/502,366, filed on May 5, 2017.

(51) Int. Cl.
*H01L 21/02* (2006.01)
*H01L 21/306* (2006.01)
*H01L 21/308* (2006.01)

(52) U.S. Cl.
CPC .. *H01L 21/30621* (2013.01); *H01L 21/02057* (2013.01); *H01L 21/02178* (2013.01); *H01L 21/02241* (2013.01); *H01L 21/02274* (2013.01); *H01L 21/308* (2013.01); *H01L 21/3081* (2013.01)

(58) Field of Classification Search
CPC ............. H01L 21/02057; H01L 21/306; H01L 21/30604; H01L 21/3081; H01L 21/3085; H01L 21/31058; H01L 21/31111; H01L 21/02178; H01L 21/02274; H01L 21/30621; H01L 21/308
USPC ...... 216/41, 47, 67; 438/714, 717, 719, 723, 438/736; 257/79, 98, 99, 102
See application file for complete search history.

(56) References Cited

U.S. PATENT DOCUMENTS

| 5,501,893 | A | 3/1996 | Laermer et al. |
| 6,284,148 | B1 | 9/2001 | Laermer et al. |
| 6,531,068 | B2 | 3/2003 | Laermer et al. |
| 9,865,772 | B2 * | 1/2018 | Bour ............ H01L 33/145 |

(Continued)

OTHER PUBLICATIONS

Bouchoule et al., "Sidewall passivation assisted by a silicon coverplate during Cl2—H2 and HBr inductively coupled plasma etching of InP for photonic devices," Journal of Vacuum Science & Technology B: Microelectronics and Nanometer Structures Processing, Measurement, and Phenomena, Mar.-Apr. 2008, pp. 666-674.

(Continued)

*Primary Examiner* — Lan Vinh
(74) *Attorney, Agent, or Firm* — Zilka-Kotab, P.C.

(57) ABSTRACT

According to one embodiment, a method includes performing a plasma etching process on a masked III-V semiconductor, and forming a passivation layer on etched portions of the III-V semiconductor. The passivation layer includes at least one of a group III element and/or a metal from the following: Ni, Cr, W, Mo, Pt, Pd, Mg, Ti, Zr, Hf, Y, Ta, and Sc.

20 Claims, 6 Drawing Sheets

(56) References Cited

U.S. PATENT DOCUMENTS

| | | | |
|---|---|---|---|
| 2007/0145417 A1* | 6/2007 | Brar | H01L 29/41766 257/213 |
| 2011/0140080 A1* | 6/2011 | Xiong | H01L 33/0079 257/13 |
| 2012/0119218 A1* | 5/2012 | Su | C30B 25/18 257/76 |
| 2014/0087499 A1* | 3/2014 | Doan | H01L 33/0095 438/28 |
| 2014/0124789 A1* | 5/2014 | Ramdani | H01L 21/28264 257/76 |
| 2014/0209861 A1* | 7/2014 | Okamoto | H01L 29/872 257/20 |
| 2015/0194514 A1* | 7/2015 | Ozaki | H01L 21/02057 257/194 |
| 2015/0255281 A1* | 9/2015 | Bruce | H01L 21/02538 438/504 |
| 2017/0200820 A1 | 7/2017 | Conway et al. | |
| 2017/0200833 A1 | 7/2017 | Conway et al. | |
| 2017/0222047 A1 | 8/2017 | Conway et al. | |

OTHER PUBLICATIONS

Gatilova et al., "Addition of Si-Containing Gases for Anisotropic Etching of III-V Materials in Chlorine-Based Inductively Coupled Plasma," Japanese Journal of Applied Physics, vol. 50, 2011, pp. 08JE02-1-08JE02-5.

Gatilova et al., "High-aspect-ratio inductively coupled plasma etching of InP using $SiH_4/Cl_2$: Avoiding the effect of electrode coverplate material," Journal of Vacuum Science & Technology B, Nanotechnology and Microelectronics: Materials, Processing, Measurement, and Phenomena, vol. 29, Mar.-Apr. 2011, pp. 020601-1-020601-5.

Urushido et al., "Influence of Ge and Si on Reactive Ion Etching of GaN in $Cl_2$ Plasma," Japanese Journal of Applied Physics, vol. 41, 2002, pp. L31-L33.

Catalan et al., "Controlling the profile of high aspect ratio gratings in diamond," Diamond & Related Materials, vol. 63, 2016, pp. 60-68.

Roozeboom et al., "Cyclic Etch/Passivation-Deposition as an All-Spatial Concept toward High-Rate Room Temperature Atomic Layer Etching," ECS Journal of Solid State Science and Technology, vol. 4, 2015, pp. N5067-N5076.

Golka et al., "Time-multiplexed, inductively coupled plasma process with separate $SiCl_4$ and $O_2$ steps for etching of GaAs with high selectivity," Journal of Vacuum Science & Technology B: Microelectronics and Nanometer Structures Processing, Measurement, and Phenomena, vol. 27, Sep.-Oct. 2009, pp. 2270-2279.

Shul et al., "High temperature electron cyclotron resonance etching of GaN, InN, and AlN," Applied Physics Letters, vol. 66, No. 14, Apr. 1995, pp. 1761-1763.

* cited by examiner

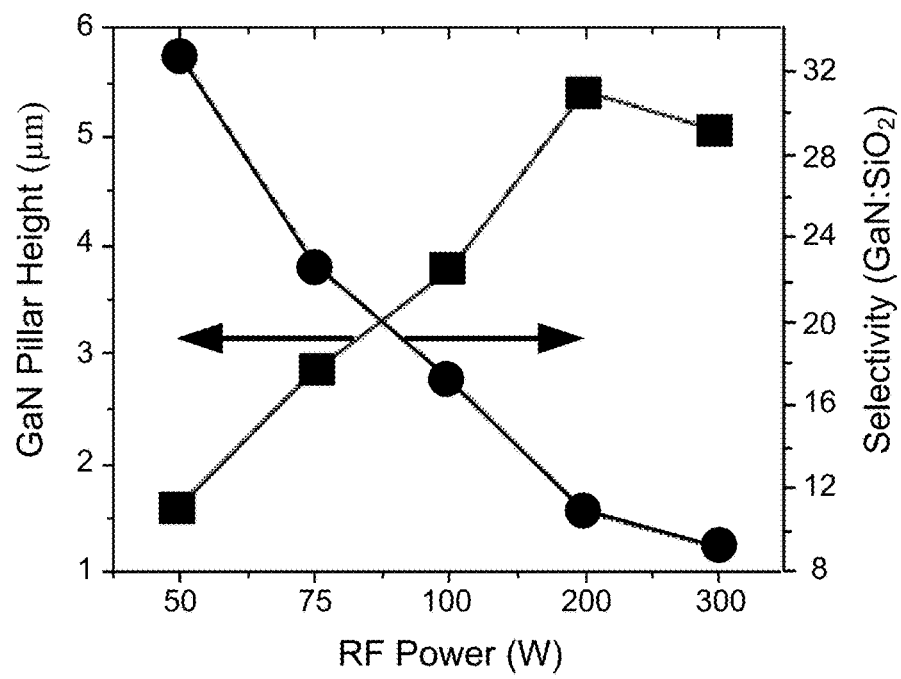
FIG. 4A
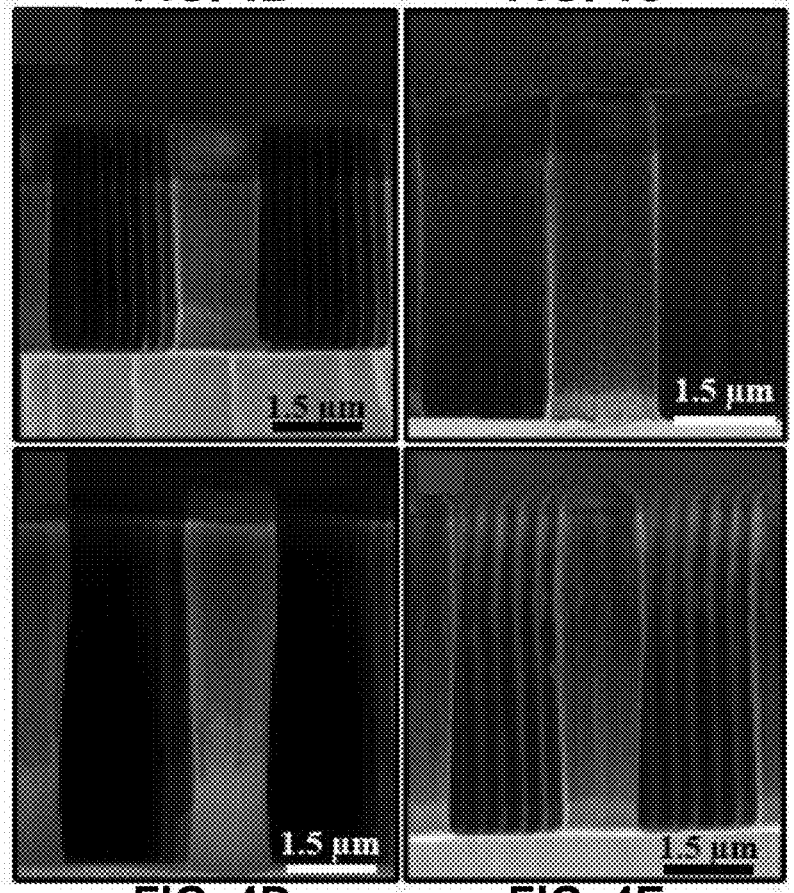
FIG. 4B  FIG. 4C
FIG. 4D  FIG. 4E

METAL-BASED PASSIVATION-ASSISTED PLASMA ETCHING OF III-V SEMICONDUCTORS

The United States Government has rights in this invention pursuant to Contract No. DE-AC52-07NA27344 between the United States Department of Energy and Lawrence Livermore National Security, LLC for the operation of Lawrence Livermore National Laboratory.

FIELD OF THE INVENTION

The present invention relates to methods for plasma etching of III-V semiconductor materials, and more particularly, this invention relates to metal-based passivation-assisted plasma etching of III-V semiconductor materials.

BACKGROUND

Plasma etching of semiconductor materials plays a key role in the fabrication of three-dimensional (3D) device architectures for electronic, optoelectronic, photonic, and microelectromechanical applications. 3D devices benefit from length scale decoupling, which for certain applications can lead to higher performance and/or space savings when compared to their two-dimensional (2D) or planar counterparts. For example, the use of 3D topologies for next generation wide bandgap (e.g. GaN) semiconductor high-power switches enables higher applied voltages and faster switching speeds within a smaller device-area footprint when compared to traditional lateral device configurations. Microfabrication of vertical or 3D devices often involves a mesa isolation step to define the body of the device and provide electrical isolation from near neighbors. Since certain semiconductor materials (e.g. GaN) have a high resistance to wet chemical etching, mesa isolation is often accomplished using plasma-based dry etching. Minimizing dry etch damage and sidewall roughness is often critical as rough and damaged etched surfaces contribute to increased leakage currents and overall device degradation.

Deep, anisotropic etch profiles with smooth and vertical sidewall morphologies are often critical requirements for meeting certain device performance objectives such as increased device area, greater electrostatic gate control, increased blocking voltage, decoupled and enhanced light absorption and charge collection, suppression of leakage currents, parasitic capacitances, and optical scattering losses, etc. Deep etching also enables flexibility in device design by providing access to sub-surface or underlying layers within the semiconductor material for formation of electrical connections, gating, etc. Maximizing the semiconductor-to-mask etch selectivity and suppressing lateral etching are important considerations for reaching targeted etch depths and maintaining precise control over etch profiles.

Passivation layers can be used to increase mask etch selectivity and promote anisotropic etch profiles. Conventional methods used in the commercial semiconductor industry, academia, and other research and development communities involve polymer-based passivation-assisted plasma etching, based on the known Bosch process, for high selectivity and deep anisotropic etching of silicon (Si). The time-multiplexed plasma etching process alternates between fluorine-based plasma etching and passivation deposition from polymer-forming fluorocarbon gases. This process can achieve silicon to photoresist etch selectivities >100:1 and 90° vertical sidewalls. Application of this method to dry etching III-V semiconductors is not typically reported since many group III fluorides are involatile and hard to remove under standard etching conditions which can make etching III-V semiconductors in fluorine-based plasmas difficult.

In addition, the use of fluorine-based plasma chemistries for dry etching of III-V semiconductors may also restrict or degrade the performance of certain etch mask materials. For example, etch masks made from dielectric films such as silicon dioxide ($SiO_2$) and/or silicon nitride ($SiN_x$) etch in fluorine-based plasma chemistries, which may significantly limit the maximum achievable III-V-to-mask etch selectivity for certain masking materials.

Deep anisotropic plasma etching of III-V semiconductors with the aid of passivation is uncommon when compared with deep anisotropic plasma etching of Si. Limited studies using passivation-assisted plasma etching of III-V semiconductors have been reported where Si-based or polymer-based passivation showed an increase in the etch anisotropy and achieved smooth etched surface morphologies. However, Si-based or polymer-based passivation materials may not be robust in some etch chemistries and under certain etching conditions (e.g. high temperature). Non-fluorine halogen-based plasma chemistries are commonly employed for dry etching III-V semiconductors since chemical reactions result in the formation of volatile etch byproducts under standard etching conditions. In addition, chemistries based on $Ar/H_2$ with or without $CH_4$ have also been used for etching of III-V semiconductors.

It would be desirable to enable ultra-deep plasma etching of three dimensional III-V semiconductor structures to fabricate three-dimensional device architectures.

SUMMARY

According to one embodiment, a method includes performing a plasma etching process on a masked III-V semiconductor, and forming a passivation layer on etched portions of the III-V semiconductor. The passivation layer includes at least one of a group III element and/or a metal from the following: Ni, Cr, W, Mo, Pt, Pd, Mg, Ti, Zr, Hf, Y, Ta, and Sc.

According to another embodiment, a structure includes a III-V semiconductor having etched portions, and a passivation layer on the etched portions of the III-V semiconductor. The passivation layer includes a group III element and/or a metal from the following: Ni, Cr, W, Mo, Pt, Pd, Mg, Ti, Zr, Hf, Y, Ta, and Sc.

Other aspects and advantages of the present invention will become apparent from the following detailed description, which, when taken in conjunction with the drawings, illustrate by way of example the principles of the invention.

BRIEF DESCRIPTION OF THE DRAWINGS

FIG. 4A is a graph depicting the variation in micropillar etch height (solid squares) and $GaN:SiO_2$ etch selectivity (solid circles) plotted as a function of RF power after 20 minutes of etching according to an experimental embodiment.

FIGS. 4B to 4E are cross-sectional SEM micrographs of nominally 2 μm diameter GaN micropillars etched for 20 min with different RF powers.

DETAILED DESCRIPTION

Figure 1:
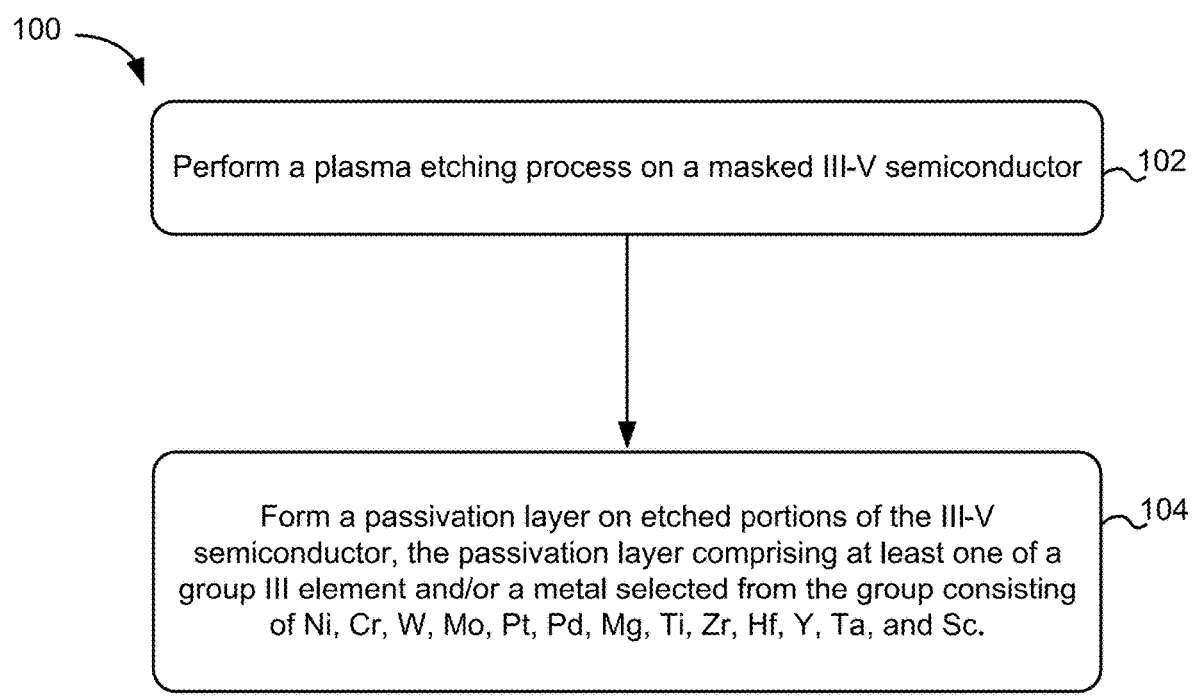
FIG. 1 is a flowchart depicting a method for deep plasma etching of III-V semiconductor material with the aid of a passivation layer, in accordance with one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of aluminum-based passivation-assisted plasma etching of III-V semiconductor materials of any type, and/or related systems, methods and products.

In one general embodiment, a method includes performing a plasma etching process on a masked III-V semiconductor, and forming a passivation layer on etched portions of the III-V semiconductor. The passivation layer includes a material consisting of a group III element and/or a metal selected from a group consisting of Ni, Cr, W, Mo, Pt, Pd, Mg, Ti, Zr, Hf, Y, Ta, and Sc.

In another general embodiment, a structure includes a III-V semiconductor having etched portions, and a passivation layer on the etched portions of the III-V semiconductor, the passivation layer comprising a material consisting of a group III element and/or a metal selected from a group consisting of Ni, Cr, W, Mo, Pt, Pd, Mg, Ti, Zr, Hf, Y, Ta, and Sc.

A list of acronyms used in the description is provided below.

2D Two dimensional
3D Three dimensional
AFM Atomic force microscopy
Al Aluminum
Ar Argon
C Celsius
$CF_4$ Tetrafluoromethane
Cl Chlorine
ECR Electron cyclotron resonance
GaAs Gallium arsenide
GaN Gallium nitride
Ge Germanium
InP Indium phosphide
$O_2$ Dioxygen
PECVD Plasma-enhanced chemical vapor deposition
RMS Root mean square
sccm Standard cubic centimeters per minute
SEM Scanning Electron Microscopy
Si Silicon
$SiO_2$ Silicon dioxide
V dc direct current self bias voltage During plasma etching, a semiconductor is typically exposed to a halogen-based or Ar/$H_2$-based etch plasma where physical and/or chemical interactions occur that cause material to be removed (etched) from unmasked regions on the surface. This process uncovers new bottom trench and sidewall surfaces in the unmasked regions on the semiconductor.

Various embodiments described herein include methods for deep anisotropic plasma etching of III-V semiconductor materials with the aid of aluminum-based passivation. Halogen-based or Ar/$H_2$ plasma chemistry may be used to etch the III-V semiconductor material in combination with the deposition of an aluminum-based coating to provide sidewall passivation, and in some embodiments, improve mask etch selectivity. Aluminum-based passivation material is deposited on exposed surfaces of the etch mask and semiconductor materials to suppress plasma etching. Passivation material deposited on the bottom trench surfaces of the semiconductor is removed by directional ion bombardment from continued exposure to the etch plasma. Removal of the passivation material in the trench bottom enables continued etching of the semiconductor trench. Passivation material deposited on the sidewall surfaces of the etch mask and semiconductor remains substantially intact and acts as a passivation layer which suppresses lateral etching from continued plasma exposure. Deposited passivation material on the etch mask surfaces may act as an additional masking layer which may increase the etch selectivity of the III-V semiconductor to the etch mask. Etching and deposition processes proceed until the desired semiconductor device structure is achieved.

Furthermore, various methods described herein improve the semiconductor to etch mask selectivity as evidenced by a relatively lower mask etch rate than found under otherwise identical conditions in the absence of the passivation material. Thus, the methodology described herein demonstrates that the Al-based passivation may function beneficially in two ways: to achieve a higher mask etch selectivity and to prevent lateral etching of the sidewall of the semiconductor.

Various embodiments described herein indicate that while the method of Al-based passivation-assisted plasma etching was initially conceived for high selectivity deep anisotropic plasma etching of III-V semiconductor materials, the methodology may also be applied to fabrication of, for example but not limited to, conformal sidewall electrical contacts, deposition of sidewall dielectric coatings and passivation layers for electronic, optoelectronic, photonic, and microelectromechanical device applications.

FIG. 1 shows a method 100 for deep plasma etching of III-V semiconductor material with the aid a passivation layer, in accordance with one embodiment. As an option, the present method 100 may be implemented to construct structures such as those shown in the other FIGS. described herein. Of course, however, this method 100 and others presented herein may be used to form structures for a wide variety of devices and/or purposes which may or may not be related to the illustrative embodiments listed herein. Further, the methods presented herein may be carried out in any desired environment. Moreover, more or less operations than those shown in FIG. 1 may be included in method 100, according to various embodiments. It should also be noted that any of the aforementioned features may be used in any of the embodiments described in accordance with the various methods.

According to one embodiment, method 100 begins with operation 102 which includes performing a plasma etching process on a masked III-V semiconductor. In various embodiments, halogen-based or Ar/$H_2$-based plasma chemistry may be used to etch the III-V semiconductor material. The semiconductor material is masked using conventional techniques, such as photoresist, dielectric layers, metal films, etc. as well known by one skilled in the art.

In one embodiment, operation 102 uses a plasma source that generates reactive halogen-based or H-based species from supplied halogen-based or $H_2$ gases. A conventional plasma etching source that is known in the art may be used to generate reactive halogen-based or H-based species to etch the semiconductor. For example, a supplied halogen-based gas or gases that are used to dry etch III-V semiconductors may include, but are not limited to $Cl_2$, $BCl_3$, HI, HBr, $F_2$, ClF, $ClF_3$, etc. Halogen-based plasmas are used for dry etching III-V semiconductors because chemical reactions between reactive halogen-based species adsorbed on the surface of the III-V semiconductor may result in highly volatile reaction products, and thus provide high etching rates.

In some approaches, the halogen-based or Ar/$H_2$-based etch plasma may physically react with the semiconductor material so that the material is physically removed (i.e. etched) from unmasked regions on the surface on the semiconductor. In other approaches, a chemical reaction may occur between the halogen-based or Ar/$H_2$-based etch plasma and the semiconductor material such that the semiconductor material is removed (i.e. etched) from unmasked regions on the semiconductor. In yet other approaches, chemical and physical reactions between the semiconductor and etch plasma may occur simultaneously such that the semiconductor material is removed (i.e. etched) from unmasked regions on the semiconductor.

In some approaches, a halogen-based or H-based gas may be the primary gas for etching the semiconductor. In other approaches, assistive gases may be added to the halogen-based or H-based gases to etch the semiconductor. In some approaches, assistive gases (for example but not limited to Ar, $N_2$, $H_2$, He, Kr, Xe, $O_2$, $CH_4$, etc.) may be incorporated into the halogen-based or Ar/$H_2$ plasma chemistry to assist with the etching process of the semiconductor. In some approaches, the assistive gases may increase bond breaking in the III-V semiconductor. In other approaches, the assistive gases may sputter-assist desorption of etch byproducts. In yet other approaches, assistive gases may increase bond breaking in the III-V-semiconductor and sputter-assist desorption of etch byproducts.

For example, in an exemplary approach, chlorine-based gas may be used with an argon gas. The argon gas may act as a sputtering component such that the chlorine chemically reacts primarily with the III-V semiconductor, and the argon helps to break the III-V semiconductor bonds and sputter away the reaction byproduct.

In one embodiment, operation 102 involving etching of the III-V semiconductor with halogen-based or Ar/$H_2$-based plasma chemistry uncovers a new bottom trench and sidewall surfaces in the unmasked regions of the semiconductor surface.

According to various embodiments, method 100 includes operation 104 which includes forming a passivation layer on etched portions of the III-V semiconductor. Continued exposure to the etch plasma may result in removal of passivation material deposited on the bottom of the trench, thereby allowing continued etching, but etching of the sidewall is passivated by the passivation material.

According to various embodiments of method 100, the passivation layer may include a material from group III elements (B, Al, Ga, In, Tl). In other embodiments, the passivation layer may include one or more metals, for example, but not limited to Ni, Cr, W, Mo, Pt, Pd, Mg, Ti, Zr, Hf, Y, Ta, Sc, etc. In yet other embodiments, the passivation layer may include material from Group III elements and metals, for example, but not limited to Ni, Cr, W, Mo, Pt, Pd, Mg, Ti, Zr, Hf, Y, Ta, Sc, etc. In various embodiments, operation 104 of the method 100 may use a group III element-based source or sources to supply the passivation material that is deposited on exposed surfaces of the etch mask and semiconductor materials. In other embodiments, operation 104 of the method 100 may use a metal-based source or sources to supply the passivation material that is deposited on exposed surfaces of the etch mask and semiconductor materials. A group III element-based or metal-based passivation may improve the etch mask selectivity by serving as an additional masking layer and provide sidewall passivation by acting as a physical and/or chemical barrier that suppresses lateral etching from continued plasma exposure.

In various embodiments, the passivation material may be derived from aluminum or any suitable aluminum-containing compound that provides a passivation layer as described herein. The resulting passivation layer may have, for example, but not limited to, any of the following compositions. In an exemplary embodiment, the passivation layer includes substantially pure aluminum. In one approach, the passivation layer includes elemental aluminum. In another approach, the passivation layer includes an aluminum oxide. In yet another approach, the passivation layer includes aluminum nitride. In yet another approach, the passivation layer includes an aluminum silicate. In yet another approach, the passivation layer includes an aluminum halide. In yet another approach, the passivation layer includes an aluminum alloy. In yet another approach, the passivation layer includes aluminum gallium nitride. In yet other approaches, the passivation layer includes a combination of one or more of the aforementioned aluminum containing compounds.

In various embodiments, the passivation material may be supplied by any of a variety of sources. In one approach, the passivation material may be supplied by solid source materials, for example, but not limited to an electrode cover plate, carrier wafer/tray, target, powder, etc. In other approaches, the passivation may be supplied by liquid source material, for example, but not limited to triethylamine alane, aqueous aluminum sulfate, trimethylaluminum, triethylaluminium, tris(diethylamino)aluminum, aqueous aluminum chloride, etc.

In various embodiments, forming the passivation layer may include applying a passivation gas to a vicinity of the III-V semiconductor. In some approaches, the passivation gas may include a material being deposited to form the passivation layer, for example, the passivation material. In an exemplary approach, aluminum passivation material may be supplied by a passivation gas from aluminum-based sources, for example, but not limited to trimethylaluminum, triethylaluminium, tris(diethylamino)aluminum, aluminum chloride, etc.

In various embodiments, the group III element-based and/or metal-based passivation media may be dispensed using a variety of methods, for example, but not limited to, the following. In one approach, the group III element-based and/or metal-based passivation media may be dispensed by thermal evaporation. In another approach, the group III element-based and/or metal-based passivation media may be dispensed by sublimation. In yet another approach, the group III element-based and/or metal-based passivation media may be dispensed by physical sputtering from plasma species bombardment and/or plasma-induced byproduct formation from chemical reactions between the source material and reactive species. Secondary sources unrelated to the primary etch plasma source that provide ion, electron, or laser beam irradiation for evaporation or sputtering of the group III element-based and/or metal-based passivation source material may also be used.

Figure 2:
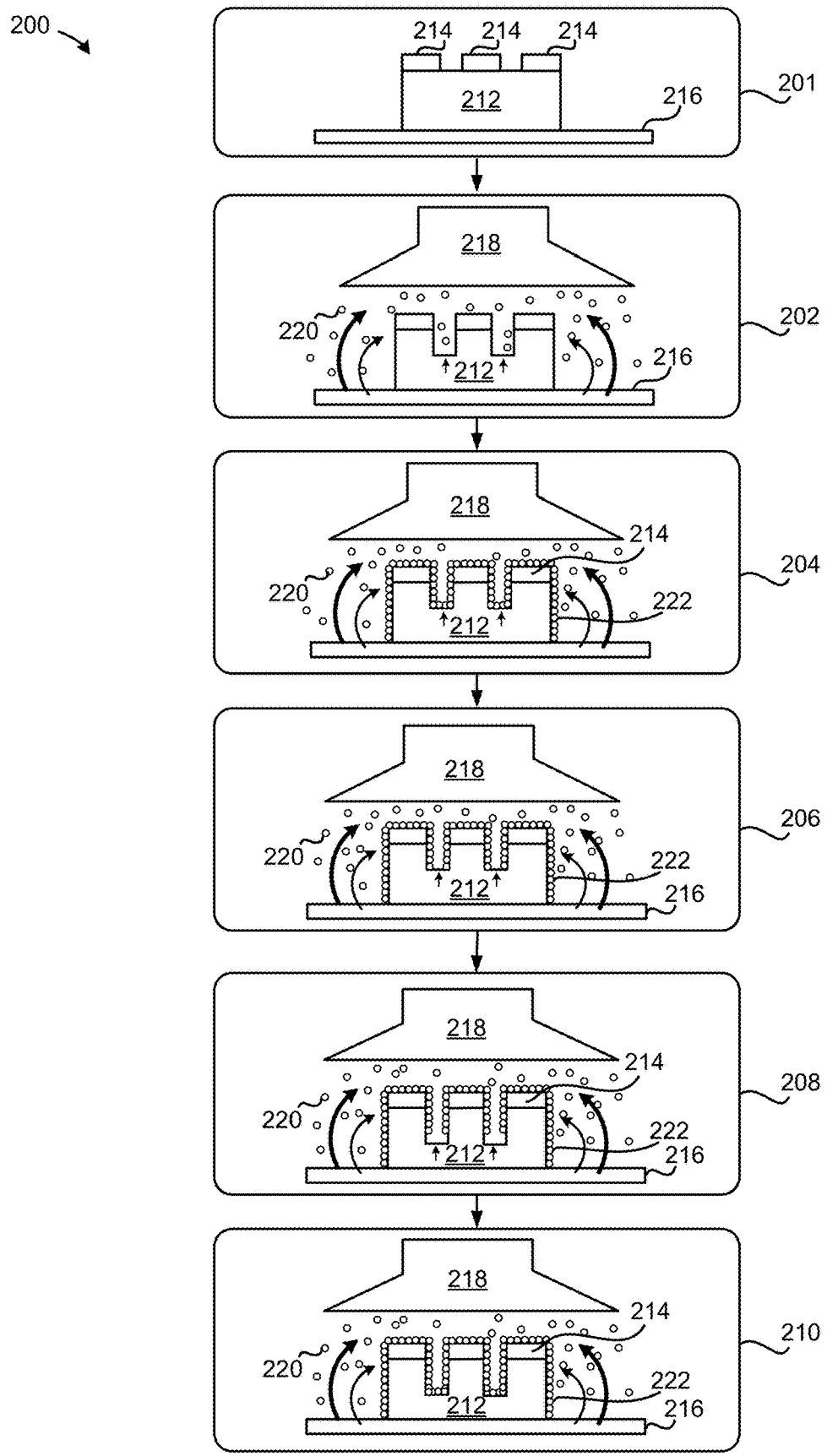
FIG. 2 depicts a sequence of steps in a method for Al-based passivation-assisted plasma etching of III-V semiconductors, in accordance with one embodiment.

FIG. 2 depicts a method 200 for Al-based passivation-assisted plasma etching of III-V semiconductors, in accordance with one embodiment. As an option, the present method 200 may be implemented in conjunction with features from any other embodiment listed herein, such as those described with reference to the other FIGS. Of course, however, such a method 200 and others presented herein may be used in various applications and/or in permutations which may or may not be specifically described in the illustrative embodiments listed herein. Further, the method 200 presented herein may be used in any desired environment.

According to one embodiment, method 200 includes passivation supplied by a solid source. Method 200 begins with a III-V semiconductor material 212 on an aluminum carrier plate 216 as shown in step 201. A conventional mask 214 may be applied to the semiconductor material 212.

According to one embodiment, method 200 involves performing a plasma etching process on a masked semiconductor. As shown in step 202, halogen-based or Ar/H$_2$ plasma 218 may be used to etch the unmasked semiconductor material 212. Plasma etch species (not visible) bombard the semiconductor material 212 and etch away the unmasked regions (small arrows) of the semiconductor material 212 in a primarily directional manner.

Moreover, the halogen-based or Ar/H$_2$ plasma 218 may react with the solid source of aluminum. For example, in step 202, halogen-based or Ar/H$_2$ plasma 218 may interact with the aluminum carrier plate 216 and may release components 220 of aluminum passivation from the solid source, as shown by the large directional arrows from the carrier plate 216. Components released from the solid source may be particles, molecules, ions, atoms, etc. Without wishing to be bound by any theory, the inventors believe the plasma hits the aluminum carrier plate 216, resulting in the aluminum components 220 being picked up and deposited, or turned into a gaseous phase, (large directional arrows) that can be deposited onto the semiconductor material 212.

A passivation layer 222 is formed on etched portions (small arrows) of the III-V semiconductor material 212 as shown in step 204. In some approaches, the passivation layer 222 forms on the surfaces of the mask 214 and the sidewalls of the semiconductor material 212.

According to one embodiment of method 200, the passivation layer may include a metal. As shown in step 204, the passivation layer 222 may include components 220 of aluminum from the solid source of the aluminum carrier plate 216.

In various embodiments, the passivation material may be dispensed onto exposed surfaces of the etch mask and semiconductor using different methods. An additive gas may be applied to the process to alter or modify the composition of the passivation material. In one embodiment, the method includes applying an additive gas to a vicinity of the III-V semiconductor for altering a composition of a material being deposited to form the passivation layer.

In one embodiment, the passivation layer may be formed concurrently with the plasma etching process. In one approach, the passivation material may be dispensed indirectly into the plasma or process gases.

In one embodiment, the passivation layer may be formed between periods of the plasma etching process.

In various embodiments, a passivation material may be dispensed simultaneously with the injection of the etch gases. In one approach, a passivation material from a solid source may be dispensed simultaneously with the injection of the etch gases. In another approach, a passivation material from a liquid source may be dispensed simultaneously with the injection of the etch gases. In yet another approach, a passivation gas may be dispensed simultaneously with the injection of the etch gases.

In various embodiments, a passivation material may be dispensed in a cyclic manner alternating between etching and passivation cycles controlled in a time multiplexed fashion. For example, one approach includes etching for a period of time (e.g., 30 seconds) then depositing passivation for a period of time and repeating these two steps in an alternating fashion. In yet other approaches, a passivation material may be dispensed in a cyclic manner alternating between etching and passivation cycles controlled through a spatial separation. For example, the method may involve moving the semiconductor into and out of separate locations in the etching chamber designated for plasma etching and passivation deposition processes. In yet other embodiments, a passivation material may be dispensed following a combination of time multiplexed methodology and spatial separation.

In various approaches described herein, the passivation material of an alternating etch-passivation method may be supplied by a solid, liquid, or gaseous source of passivation material.

In various embodiments, the passivation material may be deposited on exposed surfaces of the etch mask and semiconductor materials using any of a variety of suitable methods. In one embodiment, a passivation layer may be deposited directly onto the etch mask and semiconductor materials in an isotropic (i.e. conformal) or anisotropic (i.e. non-conformal) manner. In some approaches, the deposition rate of the passivation material may be faster, slower, or equivalent to the III-V etch rate.

According to various embodiments, the passivation layer that has been deposited on the bottom trench surfaces of the semiconductor material may be removed by directional ion bombardment from continued exposure to the etching process by halogen-based or Ar/H$_2$-based plasma thereby allowing continued etching of the semiconductor material. Looking to an exemplary embodiment in FIG. 2, the Al-based passivation layer 222 may be removed (small arrows) from the bottom surfaces of the trench surfaces of the III-V semiconductor material 212 during etching by halogen-based or Ar/H$_2$-based plasma 218 as shown in step 206.

In various embodiments, the deposition of the passivation layer on the sidewall surfaces of the etch mask and semiconductor may remain on these surfaces. In some approaches, the passivation layer may remain on the sidewall surfaces of the etch mask and semiconductor because of the directionality of the plasma ions being substantially parallel to the sidewall surfaces.

The passivation layer on the sidewall surfaces suppresses lateral etching from continued plasma exposure.

In one embodiment, the III-V semiconductor may be masked by a mask, where a material being deposited to form the passivation layer reacts with the mask thereby increasing a resistance of the mask to plasma etching.

In one approach, deposition of the passivation layer on the etch mask surfaces may act as an additional masking layer which may increase the etch selectivity of the III-V semiconductor to the etch mask in which the mask becomes more resistant to etching than it would otherwise be without the passivation material. In some embodiments, the rate of deposition of the passivation materials may be slower than the rate of etching by the halogen-based or Ar/H$_2$-based plasma.

In one embodiment, the passivation-assisted plasma etching includes actively promoting the reaction of the passivation material with the mask. Actively promoting the reaction may be defined as including an additional step(s) or a condition(s) to effect and/or accelerate the reaction. For example, in some approaches, surface reactions between the etch mask and passivation layer (e.g. $4AlCl_3(g,s)+3SiO_2(s) \rightarrow 3SiCl_4(g)+2Al_2O_3(s)$) may be promoted thermally, by photo-excitation (e.g. UV), or by particle bombardment (i.e. by electrons, ions, or neutral species), etc. In further approaches, the reaction between the etch mask and the passivation layer may occur spontaneously to further increase the etch selectivity ratio of the III-V semiconductor to etch mask.

In various embodiments, additive passivation gases such as but not limited to $O_2$, $H_2O$, $O_3$, $NH_3$, $N_2SiH_4$, $PH_3$, etc may be incorporated to aid in the passivation layer formation or to change the composition of the passivation material through processes such as but not limited to oxidation (e.g. $Al \rightarrow Al_xO_y$, etc.), reduction (e.g. $Al_xO_y \rightarrow Al$, etc), nitridation (e.g. $Al \rightarrow Al_xN_y$, etc.), etc. In some approaches, additive gases may be used to increase the selectivity of the III-V semiconductor to the etch mask. In other approaches, additive gases may be used to increase the efficacy of the sidewall passivation from lateral etching.

As shown in step 208 of FIG. 2, as continued ion bombardment occurs from the halogen-based or Ar/H$_2$-based plasma 218, the mask 214 continues to protect the underlying semiconductor from etching, perhaps even more so with the addition of the passivation layer 222, whereas the unmasked trench regions (small arrows) continue to be etched by the ion bombardment of the halogen-based or Ar/H$_2$-based plasma 218.

In various embodiments, etching and deposition processes may continue until the desired structure (e.g., etch depth, anisotropy, etc) is achieved. In some embodiments, formation of the passivation layer may be self-limiting.

In one embodiment, the method may include leaving the passivation layer on the III-V semiconductor as a permanent layer after completion of the plasma etching process. As shown in step 210 in FIG. 2, the passivation layer 222 may remain on the III-V semiconductor material 212 after completion of the plasma etching process. In some approaches, the passivation layer may be applied as a coating on all surfaces of the III-V semiconductor material.

In one approach, the passivation layer remaining in the structure may be electrically conductive. In another approach, the passivation layer remaining in the structure may be electrically insulative. In yet other approaches, the passivation layer remaining on the structure may be semiconducting.

In one embodiment, the method may include removing the passivation layer from the III-V semiconductor after completion of the plasma etching process. In one approach, after the desired structure is achieved, the passivation layer may be removed by in situ (e.g. isotropic plasma etching) methods. In another approach, after the desired structure is achieved, the passivation may be removed by ex situ (e.g., wet chemical etching) methods.

According to various embodiments, the passivation layer may remain on the etched portions of the III-V semiconductor after the plasma etching process is completed, where the passivation layer may be a part of a final semiconductor device structure. For example, a passivation layer remaining on the structure may be used as an electrical contact, dielectric coating (e.g. for electrical passivation or gate dielectrics), etc.

Figure 3:
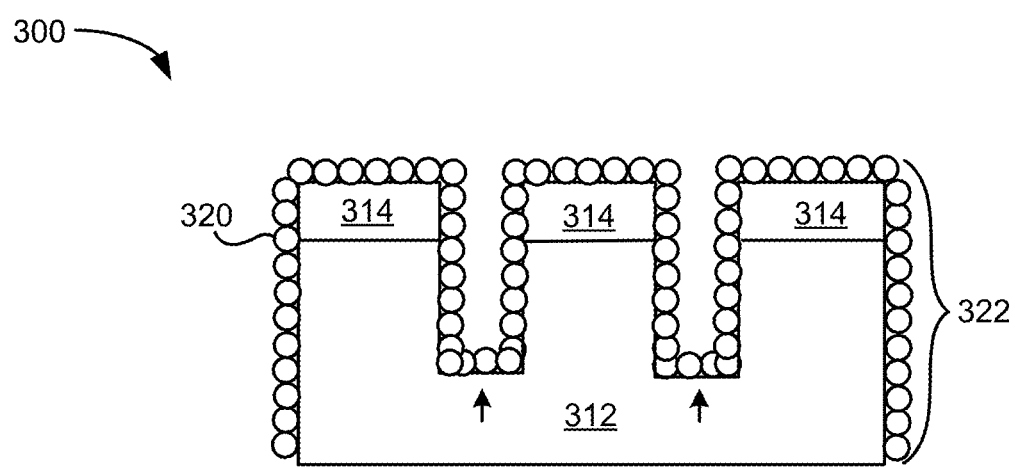
FIG. 3 is a partial cross-sectional view of a structure formed by metal-based passivation-assisted plasma etching of a III-V semiconductor in accordance with one embodiment.

FIG. 3 depicts a structure 300 formed by metal-based or group III-based passivation-assisted plasma etching of a III-V semiconductor, in accordance with one embodiment. As an option, the present structure 300 may be implemented in conjunction with features from any other embodiment listed herein, such as those described with reference to the other FIGS. Of course, however, such structure 300 and others presented herein may be used in various applications and/or in permutations which may or may not be specifically described in the illustrative embodiments listed herein. Further, the structure 300 presented herein may be used in any desired environment.

In various embodiments, a structure formed using the methodology described herein includes a III-V semiconductor having etched portions and a passivation layer on the etched portions of the III-V semiconductor. As shown in FIG. 3, according to one embodiment, a structure 300 may be formed using the methods described herein. In various embodiments, the structure 300 may be a semiconductor device structure.

The structure 300 may include a III-V semiconductor material 312 having etched portions (small arrows) and a passivation layer 322 on the etched portions of the III-V semiconductor material 312. In some approaches, a mask 314 may remain between the passivation layer 322 and the III-V semiconductor material 312. In other approaches (not shown) the mask may be removed from the structure.

In various embodiments, the passivation layer may include a group III element, transition metal, or a combination or a plurality of such materials. In one embodiment of the structure, the passivation layer includes aluminum. As shown in FIG. 3, in one embodiment of the structure 300, the passivation layer 322 includes components 320 of aluminum released from a solid source of aluminum.

In one embodiment of the structure, the passivation layer remaining on the structure may be electrically conductive.

In one embodiment of the structure, the passivation layer remaining on the structure may be electrically insulative.

In another embodiment of the structure, the passivation layer remaining on the structure may be semiconducting.

In various embodiments, group III-based or metal-based materials other than Al-based materials may be used in conjunction with or in place of Al-based materials as the source of the passivation to improve mask etch selectivity and/or provide sidewall passivation. In one embodiment, the passivation source(s) may be derived from any group III-based or metal-based materials for example, but not limited to, elemental or compounds containing B, Al, Ga, In, Th, Ni, Cr, W, Mo, Pt, Pd, Mg, Ti, Zr, Hf, Y, Ta, Sc, etc Any of these embodiments can have any feature from any of the embodiments described herein. Likewise, all embodiments listed above may have and/or may use the other group III-based or metal-based materials as the source of the passivation, according to various permutations. In other approaches, other group III-based or metal-based material(s) may be substituted for or used in combination with Al-based materials as described above.

Experimental Details

Micropillar etch studies were performed on ~20±5 µm-thick n-GaN ($3\times10^{16}$ $cm^{-3}$) epitaxial layers grown on c-plane sapphire substrates by metal organic chemical vapor deposition (University Wafer Inc., 850 Summer Street, South Boston, Mass. 02127). As received, 2-inch wafers were diced into quarters and cleaned in ultrasonic solvent baths and piranha solution (3:1 $H_2SO_4$:$H_2O_2$).

For deep GaN etching, a high-selectivity hard mask was required. Dielectric and metal-based masks were good candidates; however, to avoid potential contamination issues for future downstream processing $SiO_2$ was selected which has a reported selectivity of 4-6 in a $Cl_2$/Ar plasma. A Plasma-Therm plasma-enhanced chemical vapor deposition (PECVD) system (Plasma-Therm, 10050 $16^{th}$ Street North, Saint Petersburg, Fla. 33716) was used to deposit ~1.1 µm-thick $SiO_2$ masking layers on piranha cleaned (0001) epilayer surfaces. Deposition conditions were 400 sccm 2% $SiH_4$/$N_2$, 900 sccm $N_2O$, 40 W RF, and 900 mTorr (sccm refers to standard cubic centimeter per minute). Arrays of nominally 2.0 µm diameter circles or polygons at 5.0 µm pitch or 5.0 µm diameter circles or polygons at a 10.0 µm pitch were defined using standard photolithography. Pattern transfer onto the $SiO_2$ layer was carried out by electron cyclotron resonance (ECR) dry etching using a $CF_4$ plasma. After mask $SiO_2$ patterning, the quarter 2-inch wafers were diced into pieces and stripped of the remaining photoresist and any etch residues in ultrasonic solvent baths and piranha solution.

A Plasma Quest model 104 plasma etching system with an Astex 2.45 GHz ECR ion source was used for etching. All etches were performed with the ECR source fixed at 850 W using a magnet current of 170 A. Prior to each etch, the etch chamber was cleaned using a $CF_4$/$O_2$/Ar plasma and conditioned with a $Cl_2$/Ar plasma using the process parameters under investigation for the subsequent micropillar etch. After conditioning, samples were mounted with thermally conductive adhesive to an aluminum sample plate that was mechanically clamped to the cathode upon loading. Backside helium cooling was not employed which resulted in elevated etching temperatures (100>T>200° C.) from self-heating of the samples due to plasma exposure.

Primary etch parameters, including plasma chemistry, radio frequency (RF) power, and process pressure, were investigated.

Cross-sectional scanning electron microscopy (SEM) with a Hitachi S800 Scanning Electron Microscope (5960 Inglewood Drive, Pleasanton, Calif. 94588) was used to evaluate the micropillar etched surface morphology, profile, and etch rates. Mask etch rates were determined by spectroscopic reflectivity measurements with a Nanometrics NanoSpec 3000 (Nanometrics, 1320 SE Armour Road, Suite B-2, Bend, Oreg. 97702) on $SiO_2$-coated Si samples that were simultaneously exposed to the same plasma conditions as their companion GaN etch parts. Etch selectivity values were obtained from the ratio of the GaN-to-$SiO_2$ etch rates. Micropillar dimensions and etch rates are reported as average values acquired from measurements performed at 3 or more locations across the sample.

The Al-based coatings deposited on the sidewalls of GaN microstructures were observed in SEM measurements and the composition of the coating was later determined by Auger electron spectroscopy measurements performed by Evans Analytical Group Laboratories (EAG Laboratories, 4747 Executive Drive Suite 700, San Diego, Calif. 92121).

Experimental Results

The following description of experimental results is presented by way of example only and without limitation.

To determine baseline etch rates and examine the influence of RF power on micropillar etch characteristics, a series of 20 min etches were performed where the RF power was varied from 50-300 W. For this work a $Cl_2$/Ar plasma was used. The $Cl_2$ and Ar gas flows were varied from 10 to 50 sccm, preferably 30 sccm $Cl_2$, and 0 to 40 sccm, preferably 20 sccm Ar, respectively, with the total gas flow held constant 50 sccm. In order to achieve an anisotropic etch, the process pressure would preferably be kept at a minimum. However, lower process pressures would typically result in lower etch rates. The process pressure was varied from 1.5 to 7.5 mTorr. Standard etch times used for this work were 20 or 60 minutes. The resulting induced dc self-bias voltages (Vdc), recorded 5 min into the etch, ranged between −4 V to −128 V. All etches were carried out on nominally 2 µm diameter hexagonal $SiO_2$ etch masks.

FIG. 4A shows the variation in micropillar etch height (■) and GaN:$SiO_2$ etch selectivity (●) plotted as a function of RF power after 20 minutes of etching. Looking to the pattern of solid squares, etch depths were generally found to increase as the RF power or ion energy was increased due to enhancement of the physical sputtering component of the etch plasma. Without wishing to be bound by any theory, the inventors believe high RF powers may promote faster etch rates from increased ion bombardment which improves the Ga—N bond breaking and sputter-assisted desorption of etch by-products. From 50-200 W, the micropillar etch height extended vertically from 1.60±0.02 µm to 5.41±0.04 µm, corresponding to etch rates between ~0.08 to 0.27 µm/min. A slight drop in the etch depth (5.04±0.03 µm) was observed for the 300 W condition. Without wishing to be bound by any theory, the inventors believe this result indicated the onset of an adsorption limited etch regime where reduced etch rates can occur when the reactive species are sputtered from the surface of the sample before chemical reactions can take place. Under conditions in which RF powers <50 W, etch depths were not explored due to the slow GaN etch rates achieved by the 50 W condition.

Looking to the pattern of solid circles in FIG. 4A, the etch selectivity was found to be a strong function of RF power, monotonically decreasing as the RF power was increased. Without wishing to be bound by any theory, the inventors believe this effect is attributed to higher $SiO_2$ etch rates from increased ion bombardment of the etch mask surface. The selectivity varied from ~33:1 at 50 W to ~9.1 at 300 W, where the $SiO_2$ etch rates ranged between ~2.5-27.5 nm/min. These values were found to be ~5.5-1.5× higher than maximum selectivities typically reported for $Cl_2$-based plasma etching of GaN using $SiO_2$ hard masks.

FIGS. 4B to 4E are cross-sectional SEM micrographs of nominally 2 µm diameter hexagonal GaN micropillars etched for 20 min with RF powers of: 75 W with a $V_{dc}$=−11 V (FIG. 4B), 100 W with a $V_{dc}$=−35 V (FIG. 4C), 200 W with a $V_{dc}$=−72 V (FIG. 4D), and 300 W with a $V_{dc}$=−128

V (FIG. 4E). The SiO$_2$ masks were not removed prior to imaging to examine the as-etched micropillar surface morphology and mask profile. Interestingly, side-wall coatings, seen as dark contrast variations along the length of the micropillar body in the SEM images, were found on all as-etched samples in this study.

From visual inspection, smooth, nearly featureless etched sidewall surfaces were obtained when the applied RF power was <100 W (FIGS. 4B and 4C). Beyond this range, vertical striations, indicative of increased sidewall roughness, were observed along micropillar sidewalls. Without wishing to be bound by any theory, the inventors believe sidewall striations likely arise from enhanced etch mask erosion at the high RF power conditions (FIGS. 4D and 4E). These observations, combined with the reduced etch selectivities (<11:1 GaN:SiO$_2$), suggest that the 200 W and 300 W conditions may not be suitable for low roughness, high selectivity, deep etching.

Examination of the micropillar etch profiles within the smooth RF power etching conditions revealed slight undercutting for the 50 W (not shown) and 75 W (FIG. 4B) etches. Without wishing to be bound by any theory, the inventors believe the undercut profiles may be due to more isotropic etching from reduced ion bombardment at low RF powers, which increased the chemical component in the etch plasma. The induced dc self-bias voltage (Vdc) for the 50 W and 75 W etches were −4 V and −11 V, respectively. Increasing the RF power to 100 W (V$_{dc}$=−35 V) (FIG. 4C) was found to increase the anisotropy of the etch, producing micropillars with a vertical sidewall angle. Based on these findings, subsequent etches were performed using an RF power of 100 W.

Interestingly, coatings observed as contrast variations along the length of the micropillar sidewalls, were found on all samples etched in an ECR-generated Cl$_2$/Ar plasma with an Al carrier plate (see FIGS. 4B to 4E).

Figure 5B:
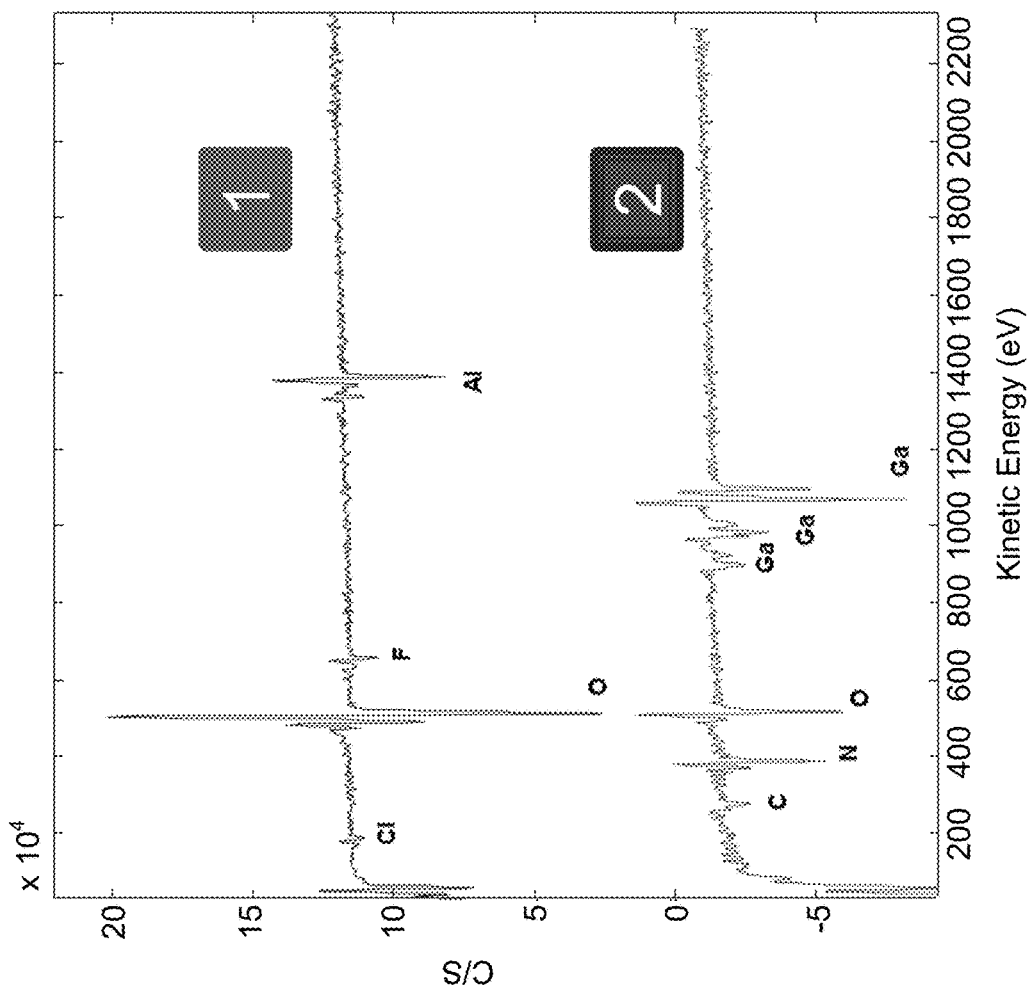
FIG. 5B is Auger spectra obtained from coated and uncoated sidewall surfaces of a GaN micropillar etched 60 min in a $Cl_2$/Ar plasma with the sample attached to a 6-inch aluminum carrier plate.
Figure 5A:
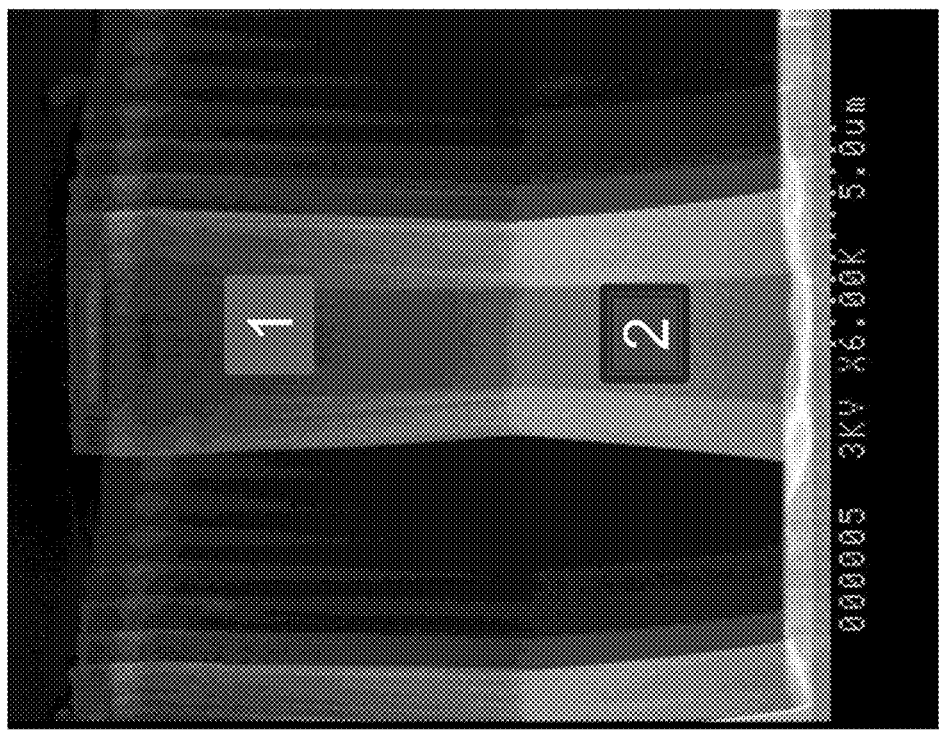
FIG. 5A is a cross-sectional SEM micrograph of nominally 5 μm diameter GaN micropillars etched for 60 min in a $Cl_2$/Ar plasma with the sample attached to a 6-inch aluminum carrier plate.

FIG. 5A shows a cross-sectional SEM image of a nominally 5 μm diameter GaN micropillar etched for 60 min on an Al carrier plate in an ECR-generated Cl$_2$/Ar plasma. A contrast difference between the top and bottom surfaces of the etched GaN micropillar is observed in the cross-sectional SEM image shown in FIG. 5A. The contrast difference is due to the presence of a sidewall coating. As shown in FIG. 5A, the locations of the regions of the pillar are indicated as follows: the coated top region (box 1) and the uncoated bottom region (box 2).

Auger spectra shown in FIG. 5B was obtained at the coated top region (indicated by box 1 in FIG. 5A) of the micropillar (upper spectra indicated by box 1 in FIG. 5B). The Auger spectra of the coated top region (upper spectra, box 1, FIG. 5B) revealed the presence of an aluminum oxide layer with a small amount of fluorine. Ar sputter etch depth profiling indicated that the aluminum oxide coating was ~415 Å thick. Similar AES measurements performed on the bottom surface of the pillar (indicated by box 2, FIG. 5A, and bottom spectra, box 2, FIG. 5B), without sidewall coating, showed a spectra characteristic of GaN with a thin layer of native oxide and adventitious carbon.

Without wishing to be bound by any theory, the inventors believe that these coatings arise from Cl$_2$-based plasma interactions with a 6-inch aluminum carrier to which the etch sample was attached during the plasma etching process. Sputtered Al-based material or Al-based etch byproducts resulting from physical and/or chemical plasma interactions with the carrier were believed to disperse aluminum material from the carrier. The dispersed aluminum material was then deposited onto the surfaces of the etch mask and unmasked regions on the GaN surface.

Figure 6B:
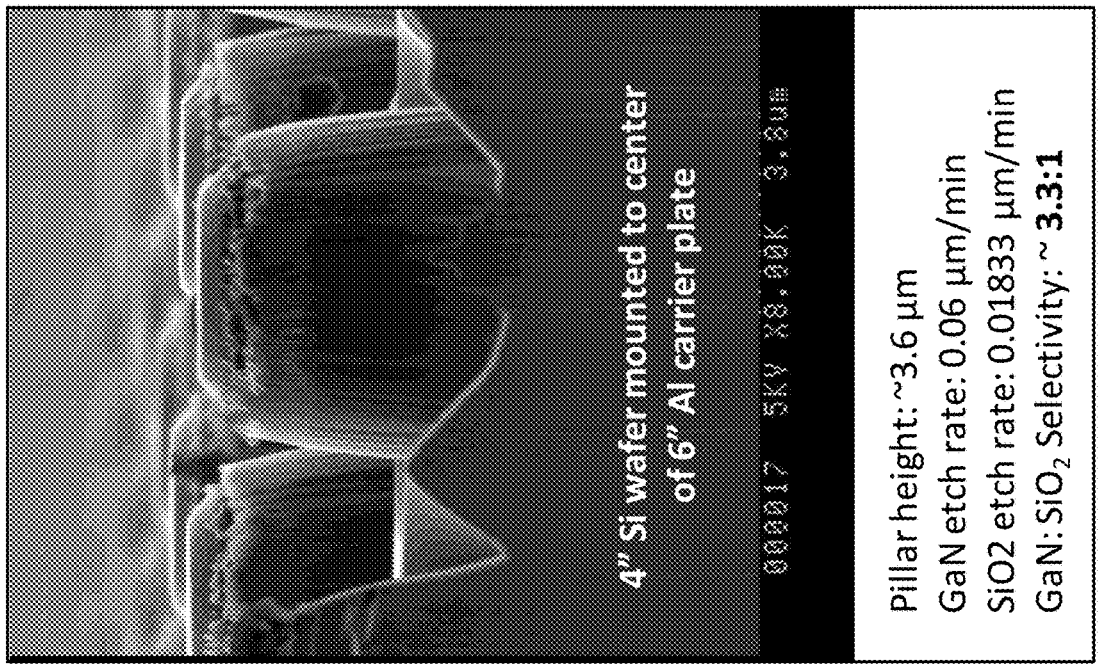
FIG. 6B is a cross-sectional SEM micrograph of nominally 5 μm diameter GaN micropillars mounted directly to silicon carrier wafer that was attached to an Al carrier plate and etched for 60 min under $Cl_2$/Ar plasma etching conditions.
Figure 6A:
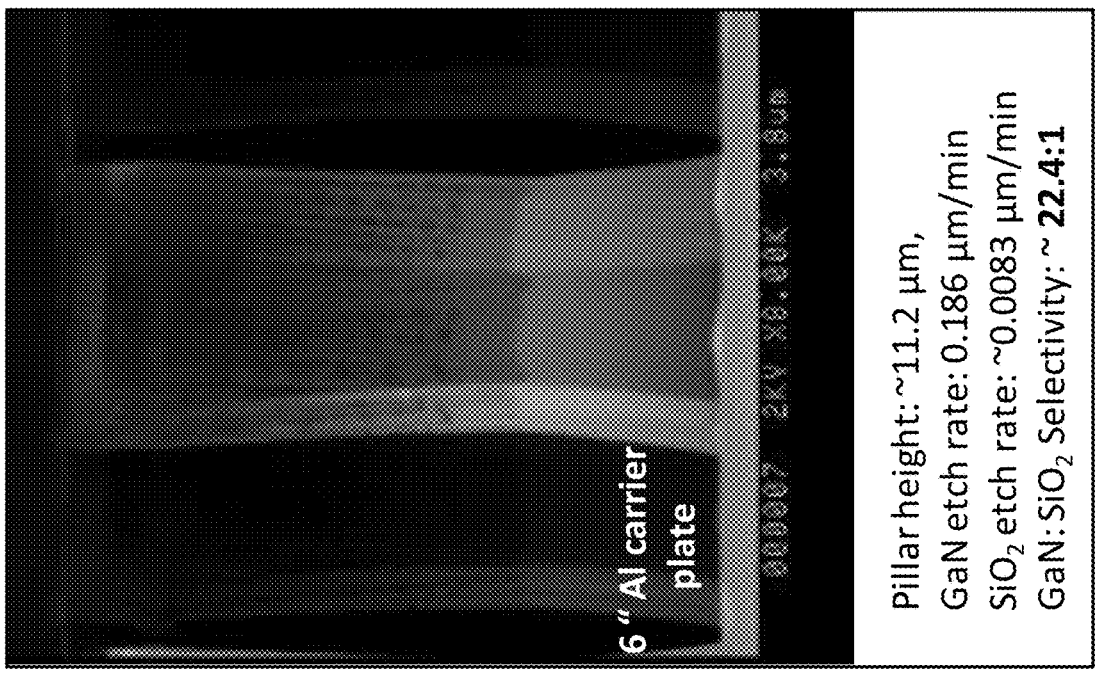
FIG. 6A is a cross-sectional SEM micrograph of nominally 5 μm diameter GaN micropillars mounted directly to an Al carrier plate and etched for 60 min under $Cl_2$/Ar plasma etching conditions.

FIGS. 6A and 6B show a comparison of GaN micropillars attached to different carriers. The 5 μm diameter GaN micropillars were etched for 60 min using identical ECR-generated Cl$_2$/Ar plasma etch conditions. The micropillars in FIG. 6A were etched with the GaN sample mounted directly to a 6-inch Al carrier plate, whereas the micropillars in FIG. 6B were etched with the GaN sample mounted directly to 4-inch silicon carrier wafers that was attached to the center of a 6-inch Al carrier plate. As shown in FIG. 6B, samples etched on Si carrier wafers did not show evidence of sidewall coatings in SEM measurements. Furthermore, samples etched on Si carrier wafers (FIG. 6B) were found to yield poor etch selectivities <6:1 GaN:SiO$_2$, faster SiO$_2$ etch rates, lower GaN etch rates, and tapered etch profiles.

In sharp contrast as shown in FIG. 6A, Al-based passivation assisted plasma etching generated >10 μm tall GaN micropillars with aspect ratios up to 6:1. Furthermore, etched sidewalls with nanoscale sidewall roughness were achieved with nearly vertical etch profiles. The maximum etch selectivities of the samples etched on the Al carrier plate reached up to ~39:1 GaN:SiO$_2$ which was ~6.5× higher than conventional values of Cl$_2$-based GaN etching. The high anisotropy and high etch selectivity appears to be correlated to the presence of the aluminum coating.

Sidewall Coatings

While coatings were clearly visible along the micropillar sidewalls in the SEM images, deposition likely occurred non-selectively on both the vertical and horizontal surfaces of the sample although the coating may interact differently with the different materials present on the wafer (i.e. GaN and SiO$_2$). In particular, any surface reaction between the Al-based coating and the SiO$_2$ mask could have altered the mask chemistry and etch characteristics which, in addition to serving as an extra masking layer, could have effectively slowed down the SiO$_2$ etch rate and increase the GaN-mask etch selectivity.

Uses

The structures presented herein may be used, for example, in electronic, optoelectronic, photonic, and microelectromechanical device applications. In embodiments in which the passivation layer remains on the surfaces of the etched structure, the passivation layer may act as electrical contacts, dielectric coatings (e.g. for electrical passivation or gate dielectrics), etc. In one approach, if the coating remains on the surfaces of the etched structure for use in device applications, the passivation layer may be used as deposited. In other approaches, if the coating remains on the surfaces of the etched structure for use in device applications, the passivation layer may be modified during and/or after deposition, for example, but not limited to, modified by exposure to additive gases, thermal treatment, photo-excitation, particle bombardment, etc.

In various embodiments described herein, the composition of the passivation coating may determine the role of the passivation layer in the device structure. For example, electrically conductive Al-based passivation may be used for electrical contacts, whereas electrically insulating oxides such as Al$_x$O$_y$-based passivation may be used as dielectric coatings or passivation layers, etc.

Furthermore, embodiments described herein may be used for high-selectivity anisotropic plasma etching of III-V semiconductors, passivation-based III-V etching, deposition of conformal aluminum-based coatings, deposition/formation of sidewall passivation, deposition/formation of sidewall electrode or electrical contact, and deposition/formation of sidewall dielectric coating.

The inventive concepts disclosed herein have been presented by way of example to illustrate the myriad features thereof in a plurality of illustrative scenarios, embodiments, and/or implementations. It should be appreciated that the concepts generally disclosed are to be considered as modular, and may be implemented in any combination, permutation, or synthesis thereof. In addition, any modification, alteration, or equivalent of the presently disclosed features, functions, and concepts that would be appreciated by a person having ordinary skill in the art upon reading the instant descriptions should also be considered within the scope of this disclosure.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A structure, comprising:
   a III-V semiconductor having etched portions comprising a sidewall and a bottom; and
   a passivation layer on the etched portions of the III-V semiconductor, the passivation layer comprising a group III element and/or a metal selected from the group consisting of Ni, Cr, W, Mo, Pt, Pd, Mg, Ti, Zr, Hf, Y, Ta, and Sc,
   wherein the passivation layer is present on the sidewall and the bottom,
   wherein the passivation layer is less present on the bottom than the sidewall, and wherein a thickness of the passivation layer is less than 500 nanometers.

2. The structure of claim 1, wherein the passivation layer comprises aluminum.

3. The structure of claim 1, wherein the passivation layer is electrically conductive.

4. The structure of claim 1, wherein the passivation layer is electrically insulative.

5. The structure of claim 1, wherein the passivation layer is semiconducting.

6. The structure of claim 1, wherein the passivation layer includes aluminum oxide.

7. The structure of claim 1, wherein the III-V semiconductor has a single composition.

8. The structure of claim 1, wherein the structure is an array of pillars, wherein each pillar has an average aspect ratio in a range of 1.5:1 to about 6:1, wherein each etched portion is between each pillar and an adjacent pillar, wherein the sidewall is oriented vertically and the bottom is oriented horizontally.

9. The structure of claim 1, wherein the sidewall is oriented perpendicular to the bottom, wherein each non-etched portion is a pillar having an average aspect ratio (height to width) greater than 2.5:1.

10. A method for forming the structure of claim 1, the method comprising:
    performing a plasma etching process on a masked III-V semiconductor, wherein the plasma etching process forms a pillar of III-V semiconductor having an average aspect ratio in a range of 1:1 to 6:1; and
    forming the passivation layer on etched portions of the III-V semiconductor, the passivation layer comprising at least one of the group III element and/or the metal selected from the group consisting of Ni, Cr, W, Mo, Pt, Pd, Mg, Ti, Zr, Hf, Y, Ta, and Sc.

11. The method of claim 10, wherein the passivation layer comprises a material selected from the group consisting of: elemental aluminum, an aluminum nitride, an aluminum silicate, an aluminum halide, an aluminum alloy, and aluminum gallium nitride.

12. The method of claim 10, wherein the passivation layer is formed concurrently with the plasma etching process.

13. The method of claim 10, wherein the passivation layer is formed between periods of the plasma etching process.

14. The method of claim 10, comprising applying an additive gas to a vicinity of the III-V semiconductor for altering a composition of a material being deposited to form the passivation layer.

15. The method of claim 10, wherein forming the passivation layer includes applying a passivation gas to a vicinity of the III-V semiconductor, the passivation gas including a material being deposited to form the passivation layer.

16. The method of claim 10, wherein the passivation layer remains on the etched portions of the III-V semiconductor after plasma etching process is completed, wherein the passivation layer is a part of a final semiconductor device structure.

17. The method of claim 10, comprising removing the passivation layer from the III-V semiconductor after completion of the plasma etching process.

18. The method of claim 10, wherein the average aspect ratio greater than 2.5:1.

19. The method of claim 10, wherein the III-V semiconductor is masked by a mask, wherein a passivation material being deposited to form the passivation layer reacts with the mask thereby increasing a resistance of the mask to plasma etching.

20. The method of claim 19, comprising actively promoting the reaction of the passivation material with the mask.

* * * * *